(12) United States Patent
Takahashi et al.

(10) Patent No.: US 10,591,018 B2
(45) Date of Patent: Mar. 17, 2020

(54) VIBRATION-SUPPRESSING MECHANISM TO BE ATTACHED TO CHARGED PARTICLE BEAM DEVICE, AND CHARGED PARTICLE BEAM DEVICE

(71) Applicant: Hitachi High-Technologies Corporation, Tokyo (JP)

(72) Inventors: Hiroki Takahashi, Tokyo (JP); Shuichi Nakagawa, Tokyo (JP); Toshihiko Shimizu, Tokyo (JP); Hironori Ogawa, Tokyo (JP); Toshihiro Arisaka, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 16/099,449

(22) PCT Filed: Jun. 14, 2017

(86) PCT No.: PCT/JP2017/021906
§ 371 (c)(1),
(2) Date: Nov. 7, 2018

(87) PCT Pub. No.: WO2018/003494
PCT Pub. Date: Jan. 4, 2018

(65) Prior Publication Data
US 2019/0145490 A1   May 16, 2019

(30) Foreign Application Priority Data
Jun. 27, 2016   (JP) .................. 2016-126168

(51) Int. Cl.
*H01J 37/16*   (2006.01)
*F16F 15/03*   (2006.01)
(Continued)

(52) U.S. Cl.
CPC ............ *F16F 15/03* (2013.01); *F16F 7/1005* (2013.01); *F16F 15/02* (2013.01); *G03F 7/709* (2013.01); *H01J 37/16* (2013.01)

(58) Field of Classification Search
CPC .......... F16F 15/03; F16F 7/1005; F16F 15/02; G03F 7/709; H01J 37/16; H01J 37/26; H01J 37/28
(Continued)

(56) References Cited

U.S. PATENT DOCUMENTS 5,310,157 A * 5/1994 Platus .................... F16F 3/026
                                                         248/619
8,059,259 B2   11/2011 Butler et al.
(Continued)

FOREIGN PATENT DOCUMENTS

JP   63-013929 A   1/1988
JP   2001-027280 A   1/2001
(Continued)

OTHER PUBLICATIONS

International Search Report of PCT/JP2017/021906 dated Oct. 3, 2017.

*Primary Examiner* — Nicole M Ippolito
(74) *Attorney, Agent, or Firm* — Mattingly & Malur, PC

(57) ABSTRACT

The vibration-suppressing mechanism includes: a first arcuate member that has an inner wall surface shaped along an outer wall of a column of a charged particle beam device; a second arcuate member that has an inner wall surface shaped along an outer wall of a column of the charged particle beam device and is connected to the first arcuate member to form an annular member surrounding the outer wall of the column of the charged particle beam device; a fastening member fastening both the first arcuate member and the second arcuate member together; a vibration sensor attached to the arcuate member; and an actuator that operates in response to
(Continued)

an output of the vibration sensor, and can be detached by releasing connection obtained by a connecting member.

12 Claims, 11 Drawing Sheets

(51) Int. Cl.
    *F16F 7/10*           (2006.01)
    *G03F 7/20*          (2006.01)
    *F16F 15/02*         (2006.01)

(58) Field of Classification Search
    USPC ............ 250/306, 307, 309, 310, 311, 492.1,
                 250/492.2, 492.21, 492.22, 492.23, 492.3
    See application file for complete search history.

(56) References Cited

U.S. PATENT DOCUMENTS

| | | | |
|---|---|---|---|
| 2002/0036264 A1* | 3/2002 | Nakasuji | G01N 23/225 250/306 |
| 2003/0197134 A1* | 10/2003 | Kurihara | B82Y 10/00 250/492.22 |
| 2014/0197331 A1 | 7/2014 | Enomoto et al. | |
| 2018/0088473 A1* | 3/2018 | Shibazaki | G03F 7/70341 |

FOREIGN PATENT DOCUMENTS

| | | |
|---|---|---|
| JP | 4954967 B2 | 6/2012 |
| JP | 2013-026150 A | 2/2013 |
| JP | 2016-039686 A | 3/2016 |
| JP | 2016-051536 | 4/2016 |

* cited by examiner

VIBRATION-SUPPRESSING MECHANISM TO BE ATTACHED TO CHARGED PARTICLE BEAM DEVICE, AND CHARGED PARTICLE BEAM DEVICE

TECHNICAL FIELD

The present disclosure relates to a vibration-suppressing mechanism to be attached to a charged particle beam device such as a scanning electron microscope and a charged particle beam device, and more particularly to a vibration-suppressing mechanism and a charged particle beam device capable of suppressing a vibration of a device that causes image blur.

BACKGROUND ART

Along with miniaturization of semiconductor devices in recent years, there is a request for higher accuracy and improvement of throughput regarding semiconductor manufacturing apparatuses and inspection devices. A scanning electron microscope (SEM), which is one of charged particle beam devices, is used for evaluation of geometry of a pattern formed on a semiconductor wafer and inspection of a defect.

In a process of measuring and inspecting a wafer by the SEM, a charged particle beam is emitted onto the wafer from an electron gun provided at the top of a column, secondary electrons released from the wafer are detected to acquire an observation image, and a pattern dimension is measured and a defect is observed based on a change in light and darkness.

Meanwhile, the smaller an object to be measured or an object to be inspected becomes, the more remarkable influence of vibrations becomes. For example, when external vibrations are transmitted to an electron microscope casing, a relative positional relationship between an electron beam scanning area and a sample is displaced so that image blur occurs. In order to suppress such image blur, PTL 1 discloses a vibration sensor configured to detect a vibration and an active damping device that controls an actuator in response to an output of the vibration sensor. In addition, PTL 2 discloses a configuration in which an active damping system provided with a sensor that detects a vibration and an actuator that operates based on a signal of the sensor is attached to a lithography apparatus having a tall beam optical system similarly to an SEM.

CITATION LIST

Patent Literature

PTL 1: JP 2001-27280 A
PTL 2: Japanese Patent No. 4954967 (corresponding U.S. Pat. No. 8,059,259)

SUMMARY OF INVENTION

Technical Problem

The active damping device and the active damping system as disclosed in PTLs 1 and 2 can effectively suppress influence on vibrations of a device particularly having a tall column, but are provided in the vicinity of an electron gun that is a replacement part, and thus, sometimes requires labor such as detachment of the active damping device at the time of replacing the electron gun. In addition, it is also considered that an appropriate position to which the active damping device or the like needs be attached differs depending on a vibration type or the like.

Hereinafter, proposed are a vibration-suppressing mechanism to be attached to a charged particle beam device and a charged particle beam device aiming at easy attachment and detachment.

Solution to Problem

As one aspect for achieving the above object, proposed is a vibration-suppressing mechanism to be attached to a charged particle beam device, the vibration-suppressing mechanism including: a first arcuate member that has an inner wall surface shaped along an outer wall of a column of the charged particle beam device; a second arcuate member that has an inner wall surface shaped along an outer wall of a column of the charged particle beam device and is connected with the first arcuate member to form an annular member surrounding the outer wall of the column of the charged particle beam device; a first connecting member that fastens one end of the first arcuate member and one end of the second arcuate member together; a second connecting member consisting of a hinge connecting the other end of the first arcuate member and the other end of the second arcuate member or a fastening member connecting the other end of the first arcuate member and the other end of the second arcuate member; a vibration sensor attached to each of the first arcuate member and the second arcuate member; and at least two actuators that operate in response to an output of the vibration sensor, in which connection between the one end of the first arcuate member and the one end of the second arcuate member is released by releasing the connection obtained by the first connecting member, and the charged particle beam device to which the vibration-suppressing mechanism has been attached.

Advantageous Effects of Invention

According to the above configuration, it is possible to provide the vibration-suppressing mechanism that is easily attached to and detached from the charged particle beam device.

DESCRIPTION OF EMBODIMENTS

An SEM used for measurement and inspection in a mass production process of semiconductor devices is required to have both high resolution and high throughput in measurement and inspection processes in order to deal with state-of-the-art devices. Meanwhile, if speed of a stage for moving a wafer is increased in order to improve the throughput, a driving reaction force at the time of operating the stage increases. As a result, a vibration of a column at the time of observing the wafer increases, which results in a variation of an irradiation position of a charged particle beam. Since the variation of the irradiation position lowers measurement accuracy of a pattern and detection accuracy of a defect, it is desirable to provide a sensor that detects an unintended vibration and a vibration element that generates a vibration to cancel out the vibration detected by the sensor. Meanwhile, it is desirable to install such a vibration control device at the top of the column where the influence of the vibration is great, but an electron source (charged particle source) is installed at the top of the column. Since the electron source is an expendable item, periodic replacement is required. When the vibration control device is attached, it is necessary to remove the vibration control device together with the replacement of the electron source. In addition, it is conceivable that there is an appropriate position for an attachment position of the vibration control device in accordance with an installation environment of an electron microscope.

Hereinafter, a vibration control mechanism, which is easily handled and capable of effective vibration control of a column, and a charged particle beam will be described with reference to the drawings.

In an embodiment to be described below, a description will be given mainly regarding a charged particle beam device that includes a column including a charged particle source configured to emit a charged particle beam and one or more vibration control mechanisms installed in the column and in which the vibration control mechanism includes an annular member installed in the column, at least two or more actuators installed in the annular member, at least two or more vibration sensors installed in the annular member, and a controller that controls the actuator in response to a signal from the vibration sensor, and the annular member is detachable from the column.

According to the present embodiment, it is possible to provide the charged particle beam device having the vibration control mechanism that is easily handled and capable of effective vibration control of the column.

First Embodiment

In the present embodiment, examples of a vibration control mechanism (vibration-suppressing mechanism), which is easily handled and capable of effective vibration control of a column, and a charged particle beam device having the vibration control mechanism will be described with reference to FIGS. 1 to 6.

Figure 1:
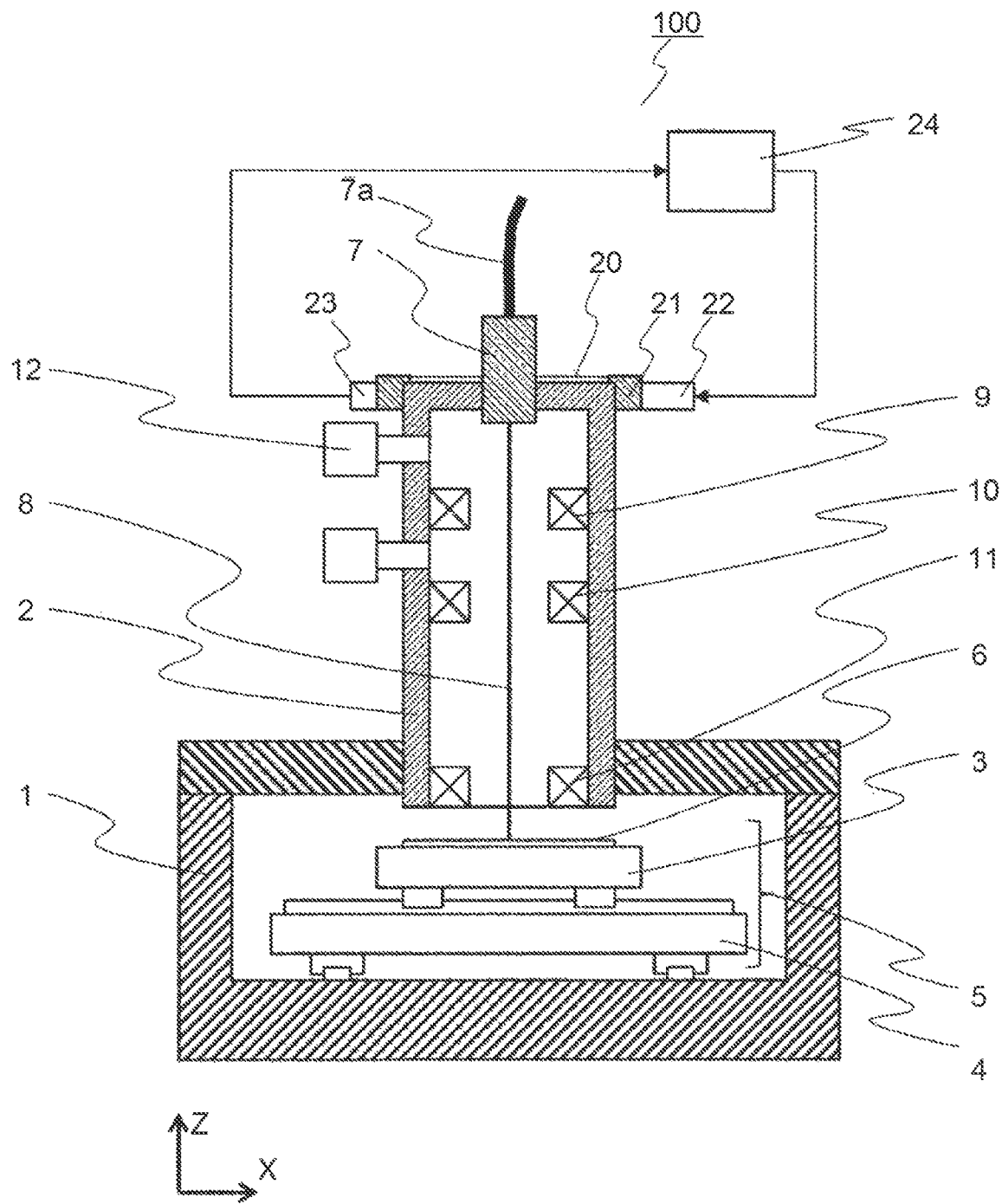
FIG. 1 is a cross-sectional view illustrating an example of a charged particle beam device according to a first embodiment.

FIG. 1 is a cross-sectional view illustrating an example of a charged particle beam device 100 according to the present embodiment. The charged particle beam device 100 includes a sample chamber 1 and a column 2 at the top of the sample chamber 1. A sample stage 5 having an X-table 3 movable in an X direction and a Y-table 4 movable in a Y direction is provided inside the sample chamber 1. A sample 6 is placed on the sample stage 5.

The inside of the sample chamber 1 is maintained in a vacuum state by a turbo molecular pump (not illustrated) and a dry pump. An electron gun 7 is provided at the top of the column 2, and the electron gun 7 generates a primary electron beam 8. A wiring 7a to the electron gun 7 is guided from above the electron gun 7. A condenser lens 9, a scanning deflector 10, and an objective lens 11 are provided inside the column 2. The inside of the column 2 is maintained in an ultrahigh vacuum state by vacuum pumping using an ion pump 12. A vibration control mechanism 20 is provided at the top of the column 2. The vibration control mechanism 20 includes a fixing ring 21 for attachment to the column 2, a vibrator 22 installed on the fixing ring 21, a vibration sensor 23 installed on the fixing ring 21 so as to oppose the vibrator 22, and a controller 24 that drives the vibrator 22 in response to a signal from the vibration sensor 23.

Figure 2:
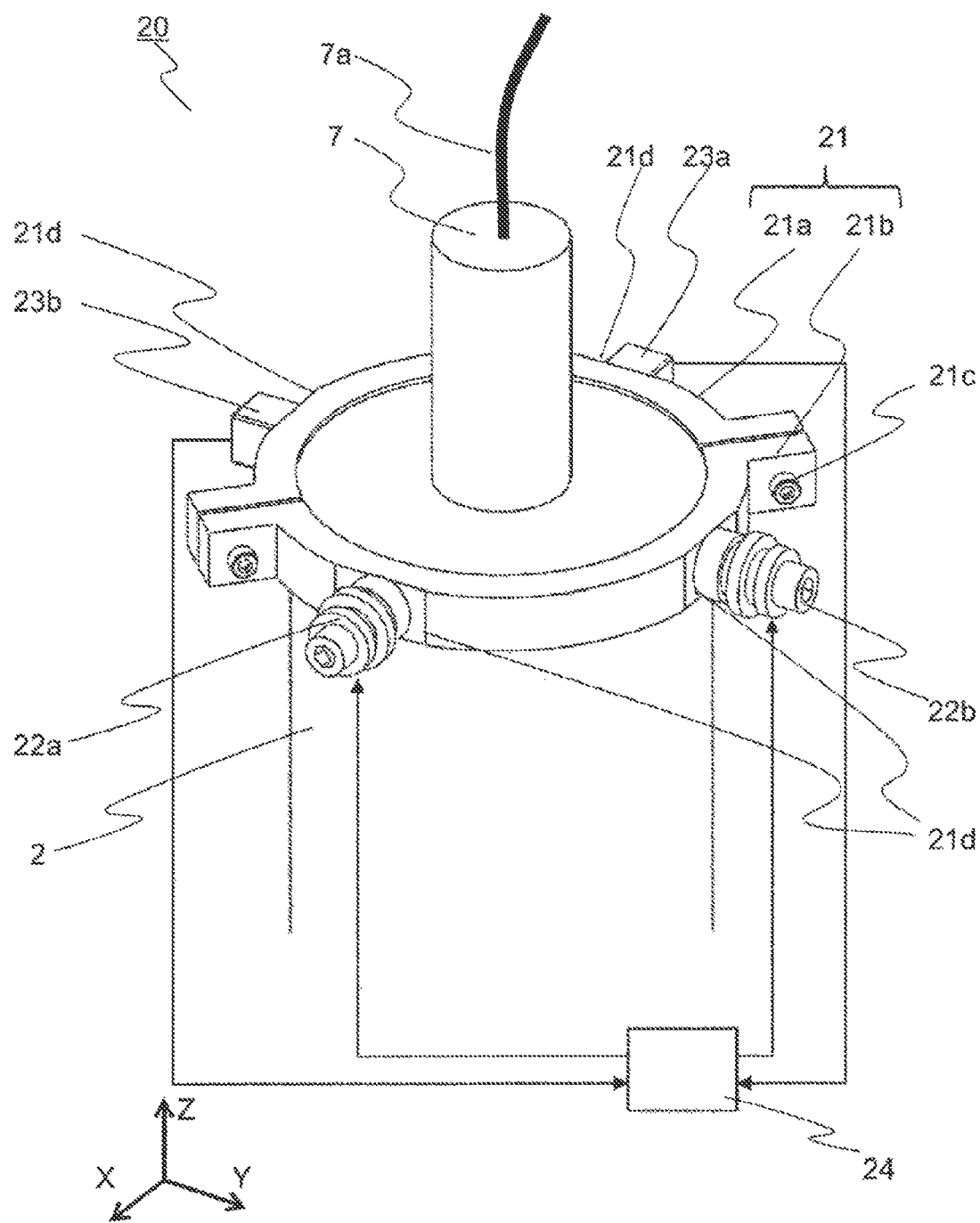
FIG. 2 is a perspective view illustrating an example of a vibration control mechanism according to the first embodiment.
Figure 3:
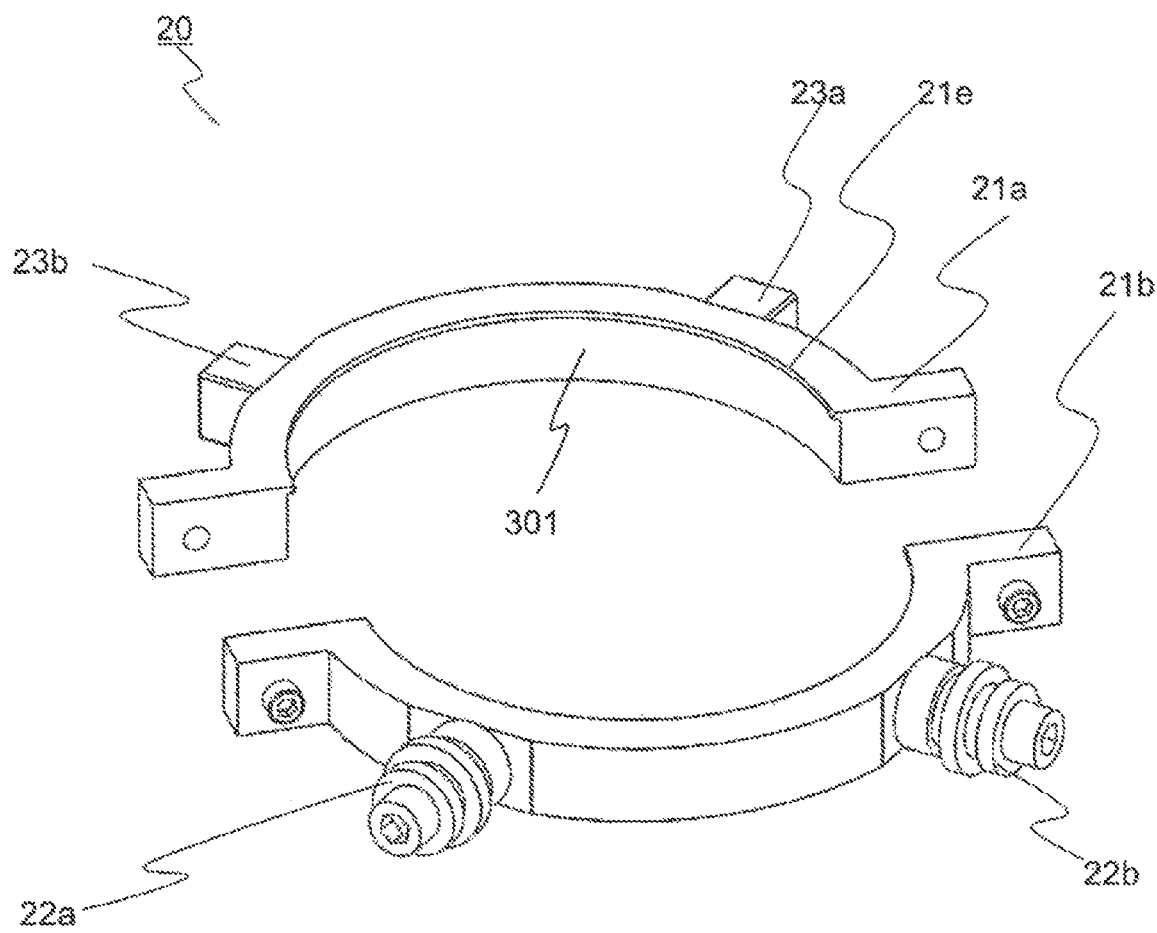
FIG. 3 is a perspective view illustrating an example of the vibration control mechanism according to the first embodiment.
Figure 3:
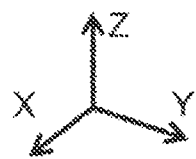

FIG. 2 is a view illustrating a state where the vibration control mechanism 20 is attached to the column 2, and FIG. 3 is a view illustrating the vibration control mechanism 20 removed from the column 2.

The fixing ring 21 includes arcuate members 21a and 21b (first arcuate member and second arcuate member) each having a flange, and is fixed to an upper end of the column 2 by being fastened by a bolt 21c (first connecting member). In the present embodiment, a description will be given regarding an example in which one end of each of the two members 21a and 21b is connected to each other by the bolt 21c, and the other end of each of the two members 21a and 21b is similarly connected to each other by a bolt 21c (second connecting member). Incidentally, an example in which the vibration-suppressing mechanism is installed at the upper end of the column 2 by providing the flange to the fixing ring 21 is described in the present embodiment, but it is also possible to attach the vibration-suppressing mechanism to the column 2 only by fastening the bolt 21c without providing the flange. With such a configuration, it is possible to install the vibration-suppressing mechanism at an arbitrary position (arbitrary column height) in accordance with a type and a degree of a vibration. In addition, column side faces (inner wall faces 301) of the members 21a and 21b are formed along an outer wall shape of the column 2 as illustrated in FIG. 3, and detection of a vibration and application of a vibration can be performed via the inner wall surface 301 as will be described later. The one end of each of the member 21a and the member 21b is connected to each other and the other end of each of the member 21a and the member 21b is connected to each other to form an annular member surrounding the column 2.

Two installation surfaces 21d are provided on each of outer peripheral surfaces of the arcuate members 21a and 21b. The installation surface 21d is formed such that the X-axis and the Y-axis are oriented in normal directions of the installation surface 21d, and the two adjacent installation surfaces 21d are orthogonal to each other. The vibrators 22a and 22b are fixed to the installation surfaces 21d so as to generate forces in the X and Y directions, respectively. In addition, the vibration sensors 23a and 23b are acceleration sensors and are fixed to the installation surfaces 21d so as to detect vibrations in the X and Y directions, respectively. The vibration sensors 23a and 23b may be a sensor that detects speed or displacement. The arcuate members 21a and 21b have ribs 21e at upper ends so as to be prevented from falling by being hooked by the upper end of the column 2. The controller 24 drives the vibrators 22a and 22b in response to signals from the vibration sensors 23a and 23b.

The bolt 21c is attached at a position where a tool such as a wrench is easily introduced from the outside in order for easy attachment and detachment of the vibration-suppressing mechanism from the outside, and the fixing ring 21 can be detached from the column 2 by detaching the bolt 21c. With such a configuration, it is possible to perform attachment, detachment, and position adjustment in accordance with the installation environment of the electron microscope or the like.

Figure 4:
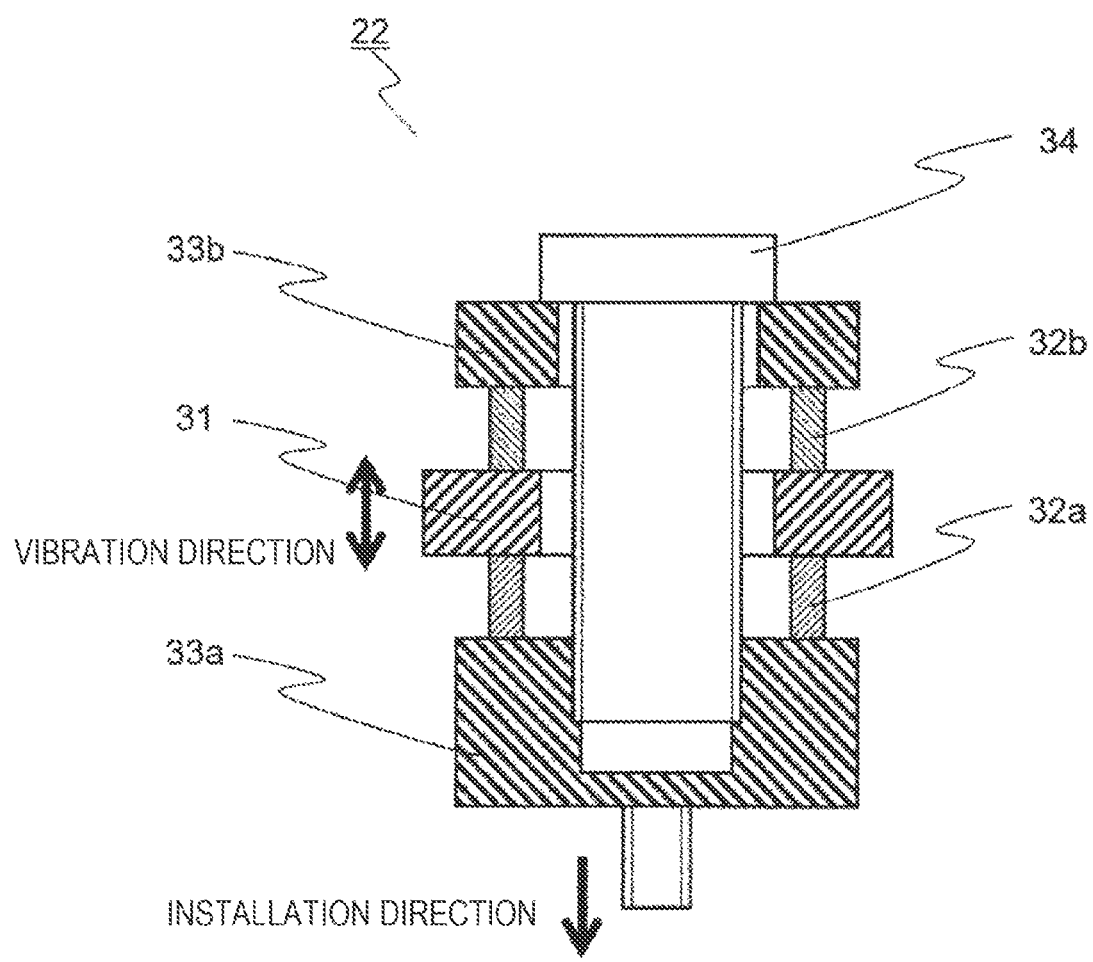
FIG. 4 is a cross-sectional view illustrating an example of a vibrator according to the first embodiment.

FIG. 4 is a cross-sectional view illustrating an example of the vibrator 22 according to the present embodiment. The vibrator 22 includes a mover 31 having a through-hole at the center, cylindrical laminated piezoelectric elements 32a and 32b arranged so as to vertically sandwich the mover 31, and stators 33a and 33b arranged so as to further vertically sandwich the laminated piezoelectric elements 32a and 32b.

The upper stator 33b has a through-hole at the center, and the lower stator 33a has a female screw at the center. A fixing bolt 34 fastens the stators 33a and 33b together to fix the mover 31, the laminated piezoelectric elements 32a and 32b, and the stators 33a and 33b such that there is no gap. The fixing bolt 34 serves as a support portion that keeps a space between a lower surface (first surface) of the stator 33b and an upper surface (second surface) of the stator 33a constant regardless of the operation of the mover 31. The lower stator 33a has a male screw at the bottom and is fixed to the fixing ring 21. When a voltage is applied, the laminated piezoelectric elements 32a and 32b extend and contract in the vertical direction of the drawing to vibrate the mover 31. The vibrator 22 uses a driving reaction force of the mover 31 as a vibrating force. The fixing bolt 34 having a bolt diameter that allows rigidity in a vibration direction of the fixing bolt 34 to be higher than rigidity in the vibration direction of the laminated piezoelectric elements 32a and 32b is selected.

Figure 5:
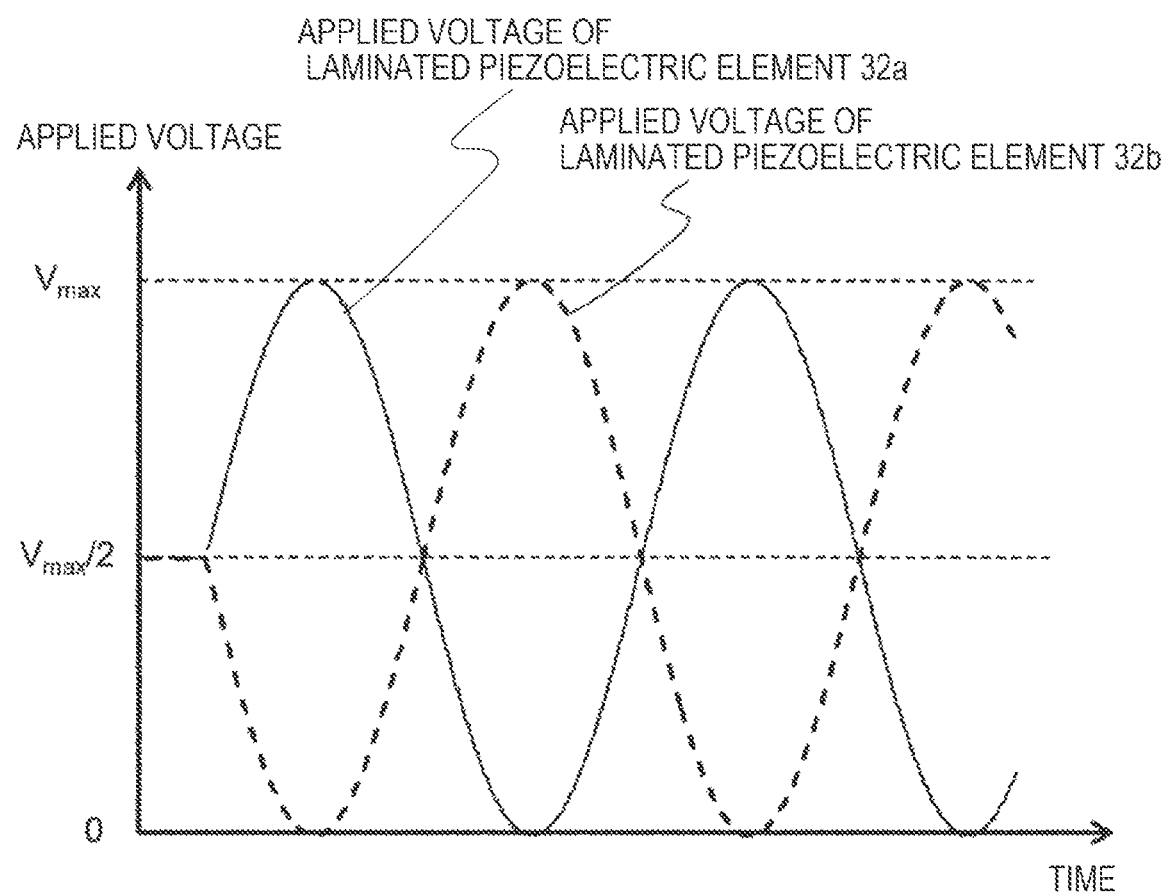
FIG. 5 is a view illustrating an example of an applied voltage to drive the vibrator according to the first embodiment.

FIG. 5 is a graph illustrating an example of a sinusoidal signal applied to the laminated piezoelectric elements 32a and 32b when driving the vibrator 22. Since the laminated piezoelectric elements 32a and 32b are resistant to a compressive force but vulnerable to a tensile force, control is performed in accordance with such characteristics. Specifically, a half $V_{max}/2$ of a maximum drive voltage $V_{max}$ is applied to the piezoelectric element before the operation thereof to form a state where a preload has been applied. At the time of driving, opposite-phase voltages with opposite signs are applied to the laminated piezoelectric elements 32a and 32b, respectively, while applying $V_{max}/2$ as a bias voltage. When the lower laminated piezoelectric element 32a extends (presses the mover), the upper laminated piezoelectric element 32b contracts (pulls the mover), thereby sinusoidally vibrating the mover 31. Similarly, $V_{max}/2$ is applied as the bias voltage when the vibrator 22 is operated with a random signal, and opposite-phase voltages with opposite signs are applied to the laminated piezoelectric elements 32a and 32b, respectively.

An effect of the present embodiment will be described. The sample 6 is positioned at a desired position by the sample stage 5. The primary electron beam 8 released from the electron gun 7 is condensed by the condenser lens 9 and is caused to two-dimensionally scan a surface of the sample by the scanning deflector 10 in the state of being focused on the surface of the sample 6 by the objective lens 11.

Secondary electrons are released from the surface of the sample 6 irradiated with the primary electron beam 8, and are detected by a secondary electron detector (not illustrated). When an output of the secondary electron detector is set to be an image signal synchronized with a scanning signal of the scanning deflector 10, an observation image can be generated. The vibration generated in the column 2 due to the positioning operation of the sample stage 5, the operation of the ion pump 12, disturbance or the like derived from the installation environment or the like is detected by the vibration sensors 23a and 23b. The controller 24 drives the vibrators 22a and 22b so as to suppress the vibration of the column 2 (to cancel out the vibration) in response to the signals from the vibration sensors 23a and 23b. Since the vibration of the column 2 at the time of observing the sample 6 is reduced, the vibration at the irradiation position of the primary electron beam 8 with respect to the sample 6 is also reduced so that it is possible to obtain the observation image while suppressing the image blur.

Since the vibrators 22a and 22b and the vibration sensors 23a and 23b are installed in the fixing ring 21 and are unitized as the vibration control mechanism 20 and can be installed by opening or closing the fixing ring 21, it is easy to attach and detach to and from the column 2 while avoiding the wiring 7a led to the electron gun 7, and it is easy to perform the assembly and maintenance of the charged particle beam device 100. Further, an imaginary straight line connecting the vibrator 22a and the vibration sensor 23a and an imaginary straight line connecting the vibrator 22b and the vibration sensor 23b are orthogonal to each other, and these imaginary straight lines are oriented in the X and Y directions (vibration directions of the mover by the vibrators are oriented in the X and Y directions), and thus, it is possible to reduce the vibration in an arbitrary direction within the XY plane of the column 2. Although the vibration control mechanism 20 is installed in a state where the vibrators 22a and 22b and the vibration sensors 23a and 23b are oriented in the X and Y directions, respectively, in the present embodiment, the vibration control mechanism 20 may be installed in the state of being rotated about the axis of the column 2. Since directions of vibration modes of the column 2 are not necessarily coincident with the X and Y directions, it is possible to reduce interference between the vibrator 22a and the vibration sensor 23b and between the vibrator 22b and the vibration sensor 23a, which are orthogonal to each other, and to allow an easy design of a control system by installing the vibrators 22a and 22b and the vibration sensors 23a and 23b so as to follow the directions of the vibration modes of the column 2, respectively.

Since the column 2 has a columnar structure, in general, an amplitude of the top thereof is likely to be large, and the top with the large amplitude is desirable as an installation place of the vibration control mechanism 20 in terms of effective vibration control. Since the electron gun 7 is positioned at the top of the column 2, if an electromagnetic actuator that generates a magnetic field is used as the vibrator 22, the magnetic field affects the primary electron beam 8 to give adverse influence to the observation image. When a nonmagnetic actuator is used, it is possible to suppress the influence on the observation image. Since the laminated piezoelectric elements 32a and 32b are used for the vibrator 22 in the present embodiment, the vibration control can be performed without the adverse influence on the observed image. In addition, the laminated piezoelectric elements 32a and 32b have high response speed, it is also possible to reduce a relatively high-frequency vibration.

Although the vibration control mechanism 20 is installed only at the uppermost portion of the column 2 in FIGS. 1 and 2, the vibration control mechanism 20 may be installed at a position other than the uppermost portion of the column 2 depending on the vibration mode of the column and a vibration frequency. When there is a portion (height) where the amplitude is the largest other than the uppermost portion of the column 2, the vibration control mechanism 20 may be attached to the height. In addition, a plurality of the vibration control mechanisms 20 may be installed in the column 2. When the plurality of vibration control mechanisms 20 is used, it is possible to effectively control vibrations of a plurality of vibration modes. According to the detachable vibration control mechanism (vibration-suppressing mechanism) as described above, it is possible to perform appropriate vibration control in accordance with the vibration type, the installation environment of the electron microscope, and the like.

Figure 6:
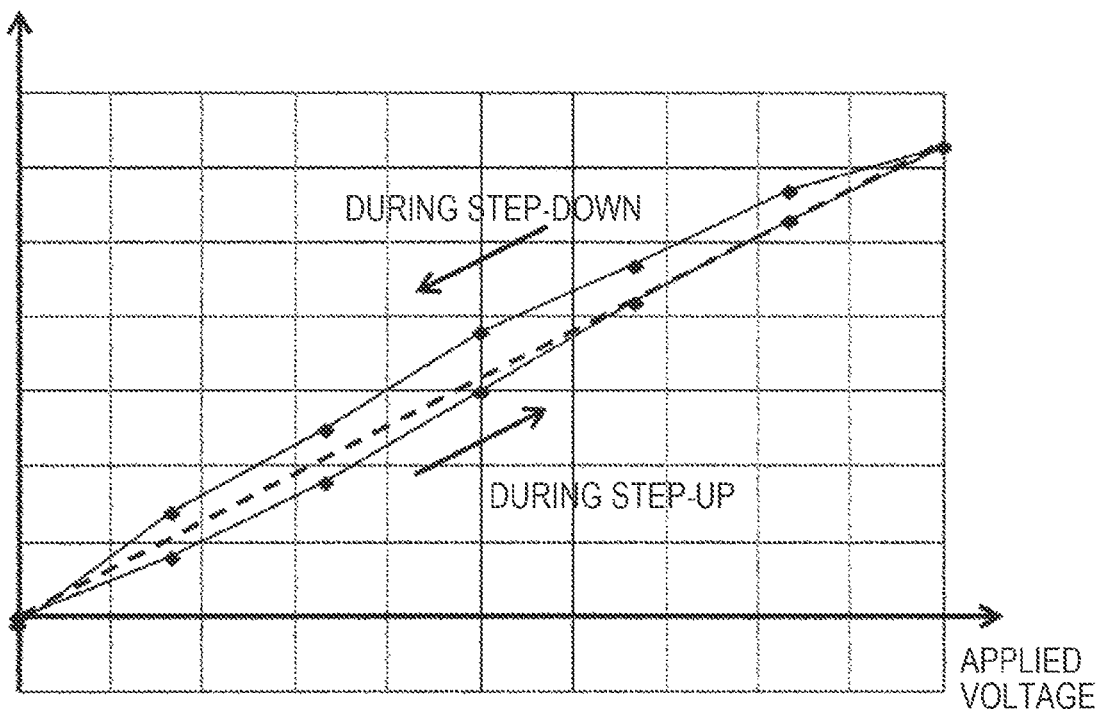
FIG. 6 is a graph for describing an effect of the vibrator according to the first embodiment.

FIG. 6 is a graph illustrating a relationship between a displacement amount of the laminated piezoelectric element and an applied voltage. As illustrated in FIG. 6, the displacement of the laminated piezoelectric element is not perfectly proportional to the applied voltage and has a hysteresis characteristic. Therefore, when a vibrator in which a mover is vibrated by a single laminated piezoelectric element is used, a vibrating force also contains harmonic components of its driving frequency. As illustrated in FIG. 6, such a hysteresis characteristic differs between step-up and step-down, and is close to a linear characteristic at the step-up than at the step-down. Thus, when the laminated piezoelectric elements 32a and 32b are used in the opposing state as in the present embodiment, it is possible to reduce the influence of hysteresis characteristic and to reduce the influence of harmonic components to the vibrating force. In addition, each maximum stroke of the laminated piezoelectric elements 32a and 32b is generally in an order of 0.1%, and for example, only about 10 μm can be obtained with respect to a length of 10 mm. It is necessary to perform the assembly in such a manner that there is no gap between both ends of the laminated piezoelectric elements 32a and 32b at the time of the assembly in order to obtain the preload by applying the bias voltage of Vmax/2. Even if the tolerance of the thickness of the laminated piezoelectric elements 32a and 32b is large, the laminated piezoelectric elements 32a and 32b can be assembled without any gap and easily assembled by fixing the laminated piezoelectric elements 32a and 32b to be fastened together in the vibration direction using the fixing bolt 34. In addition, when the rigidity in the vibration direction of the fixing bolt 34 is set to be higher than the rigidity in the vibration direction of the laminated piezoelectric elements 32a and 32b, the stators 33a and 33b positioned at both ends of the laminated piezoelectric elements 32a and 32b can be regarded as an integral rigid body with respect to the mover 31. As a result, it is possible to drive the mover 31 by reducing the hysteresis characteristic of the laminated piezoelectric elements 32a and 32b without individually vibrating the stators 33a and 33b.

Second Embodiment

Figure 7:
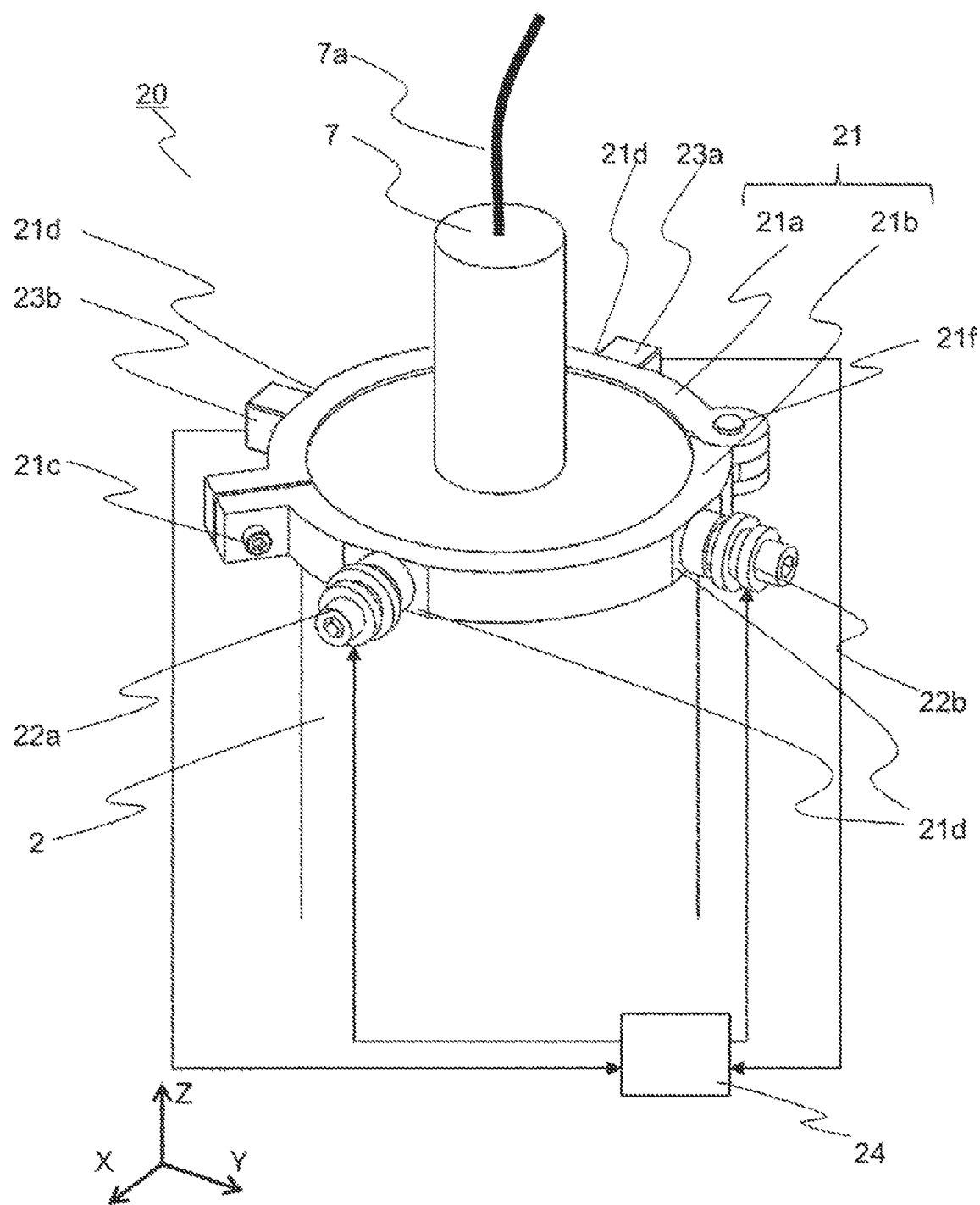
FIG. 7 is a perspective view illustrating an example of a vibration control mechanism according to a second embodiment.
Figure 8:
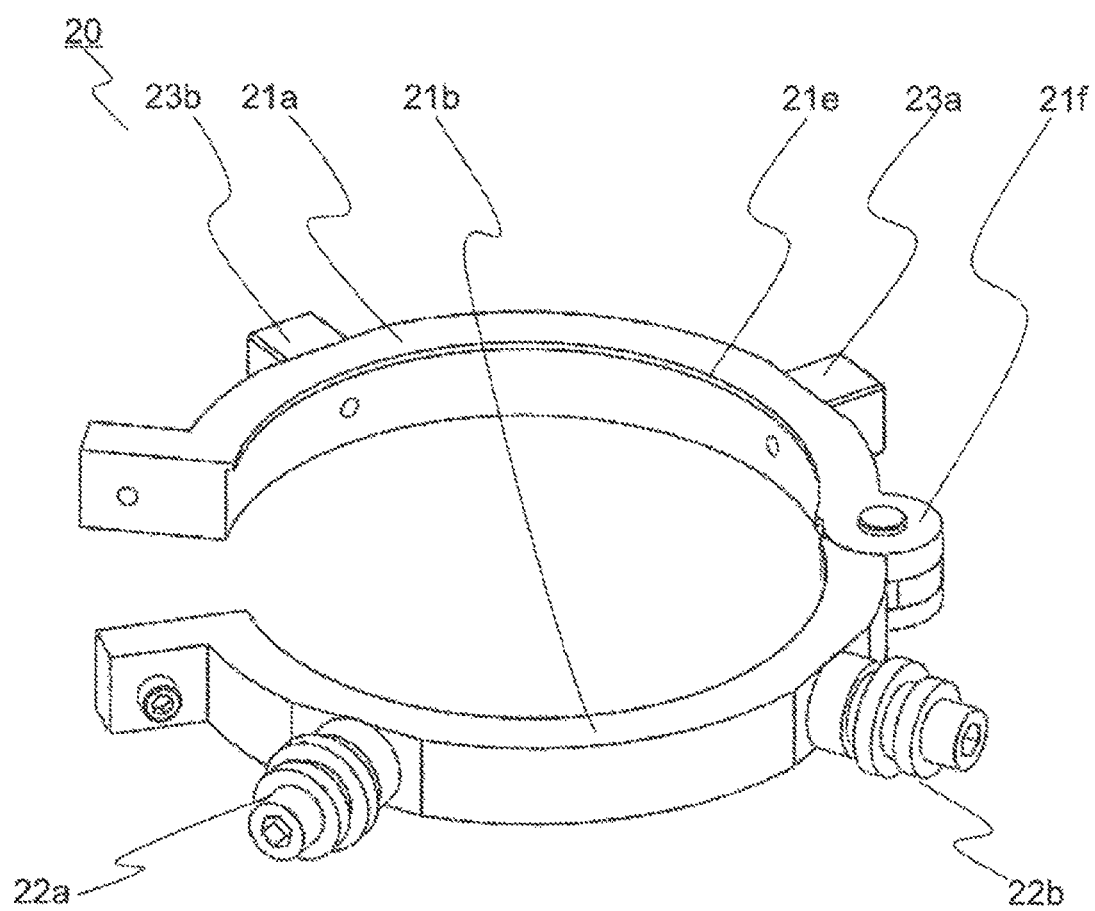
FIG. 8 is a perspective view illustrating an example of the vibration control mechanism according to the second embodiment.

An example of a charged particle beam device having a vibration control mechanism that is easier to handle than that of the first embodiment will be described in the present embodiment. FIG. 7 is a perspective view illustrating a state where a vibration control mechanism 20 according to the present embodiment is attached to a column 2, and FIG. 8 is a perspective view of the vibration control mechanism 20 removed from the column 2. In FIGS. 7 and 8, those having the same functions as those in FIGS. 2 and 3 will be denoted by the same reference signs, and redundant descriptions will be omitted. A fixing ring 21 includes a flange and arcuate members 21a and 21b having a hinge 21f (second connecting member), and is fixed to an upper end of the column 2 by a bolt 21c. Each of the arcuate members 21a and 21b has two installation surfaces 21d, and is installed such that the XY axes become the normal directions of the installation surface 21d. The vibrators 22a and 22b are fixed to the installation surfaces 21d so as to generate forces in the X and Y directions, respectively.

In addition, the vibration sensors 23a and 23b are fixed to the installation surfaces 21d so as to detect vibrations in the X and Y directions, respectively. The arcuate members 21a and 21b have ribs 21e at upper ends so as to be prevented from falling by being hooked by the upper end of the column 2. The controller 24 drives the vibrators 22a and 22b in response to signals from vibration sensors 23a and 23b. In the present embodiment, the arcuate members 21a and 21b are coupled so as to be openable and closable by the hinge 21f, and thus, are easily attached and detached even when the vibration control mechanism 20 is detached. The other effects are the same as those of the first embodiment.

Third Embodiment

Figure 9:
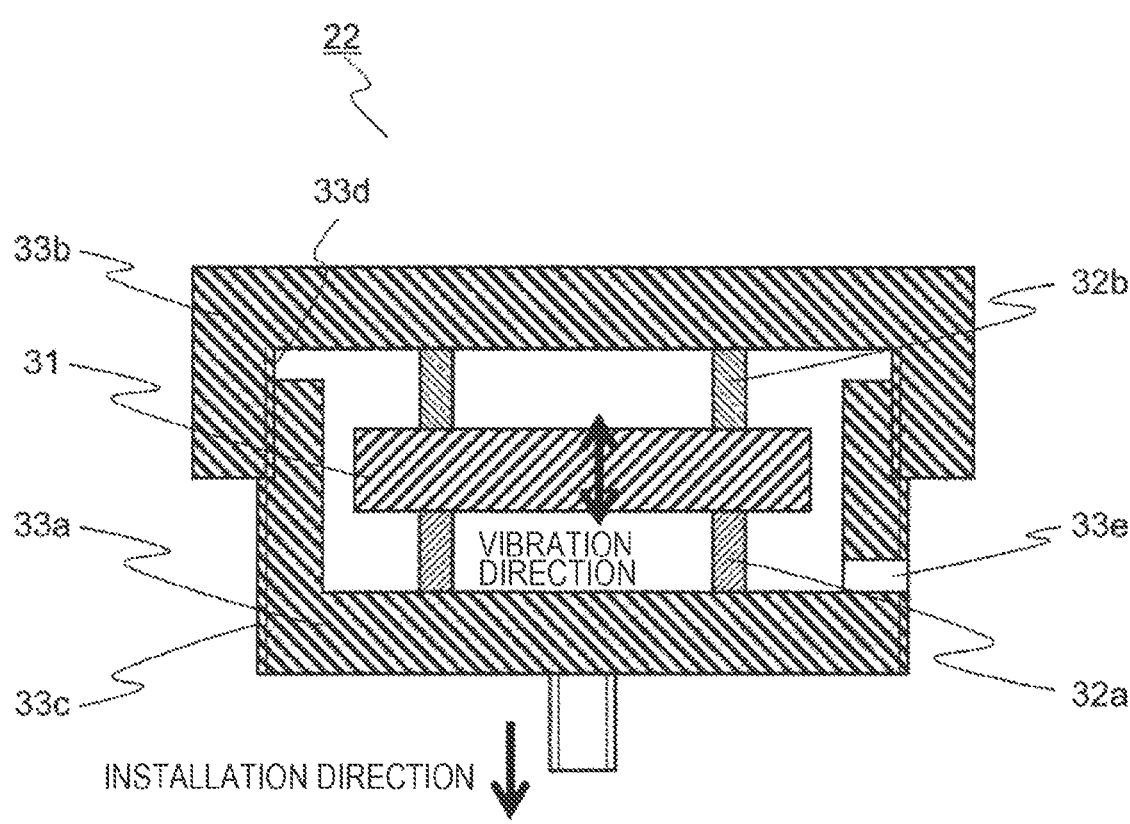
FIG. 9 is a cross-sectional view illustrating an example of a vibrator according to a third embodiment.

A vibration control mechanism that is easier to handle than those of the first and second embodiments will be described in the present embodiment. FIG. 9 is a cross-sectional view illustrating an example of a vibrator 22 according to the present embodiment. In FIG. 9, those having the same functions as those in FIG. 4 will be denoted by the same reference signs, and redundant descriptions will be omitted. The vibrator 22 illustrated in FIG. 9 includes: a mover 31; laminated piezoelectric elements 32a and 32b arranged so as to vertically sandwich the mover 31; and stators 33a and 33b arranged so as to further vertically sandwich the laminated piezoelectric elements 32a and 32b.

Both of the stators 33a and 33b have a cylindrically shape with a bottom, the lower stator 33a has a male screw portion 33c on the outer periphery thereof and the upper stator 33b has a female screw portion 33d on the inner periphery thereof, and the male screw portion 33c and the female screw portion 33d are configured to mesh with each other. The male screw portion 33c and the female screw portion 33d are fastened together in a state where the mover 31 and the laminated piezoelectric elements 32a and 32b are accommodated in an internal space formed by the stators 33a and 33b, and the mover 31 and the laminated piezoelectric elements 32a and 32b are fixed such that there is no gap and the stators 33a and 33b and the laminated piezoelectric elements 32a and 32b are fixed such that there is no gap. The lower stator 33a has a through-hole 33e in a part of a side surface, and a wiring led to the laminated piezoelectric elements 32a and 32b is guided to the outside through the through-hole 33e. In the present embodiment, the stator 33a and the stator 33b fastened together by screwing serve as support portions that maintain a distance between opposing surfaces of both the stators.

The lower stator 33a has a male screw at the bottom and is fixed to the fixing ring 21. When a voltage is applied, the laminated piezoelectric elements 32a and 32b extend and contract in the vertical direction of the drawing to vibrate the mover 31. The vibrator 22 uses a driving reaction force of the mover 31 as a vibrating force. The rigidity of fastening the stators 33a and 33b together in the vibration direction is set to be higher than the rigidity in the vibration direction of the laminated piezoelectric elements 32a and 32b. As the laminated piezoelectric elements 32a and 32b are formed in a cylindrical shape having a through-hole in the center, the low rigidity can be obtained.

In the present embodiment, the vibrating mover 31 and laminated piezoelectric elements 32a and 32b are not exposed to the outside but are accommodated inside the stators 33a and 33b so that it is possible to reduce the possibility of contact with other members. In addition, it is possible to make the inside airtight by attaching a gap between the male screw portion 33c and the female screw portion 33d, and as a result, it is possible to prevent the laminated piezoelectric elements 32a and 32b from absorbing moisture and to improve the reliability.

When the stators 33a and 33b are fixed to be fastened together in the vibration direction by the male screw portion 33c and the female screw portion 33d at the time of assembly, it is possible to perform the assembly without any gap even if the tolerance of the thicknesses of the laminated piezoelectric elements 32a and 32b is large, and the assembly work becomes easy. In addition, when the rigidity in the state where the stators 33a and 33b are fastened together in the vibration direction is set to be higher than the rigidity in the vibration direction of the laminated piezoelectric elements 32a and 32b, the stators 33a and 33b positioned at both ends of the laminated piezoelectric elements 32a and 32b can be regarded as an integral rigid body with respect to the mover 31. As a result, it is possible to drive the mover 31 by reducing the hysteresis characteristic of the laminated piezoelectric elements 32a and 32b without individually vibrating the stators 33a and 33b. The other effects are the same as those of the first to second embodiments.

Fourth Embodiment

Figure 10:
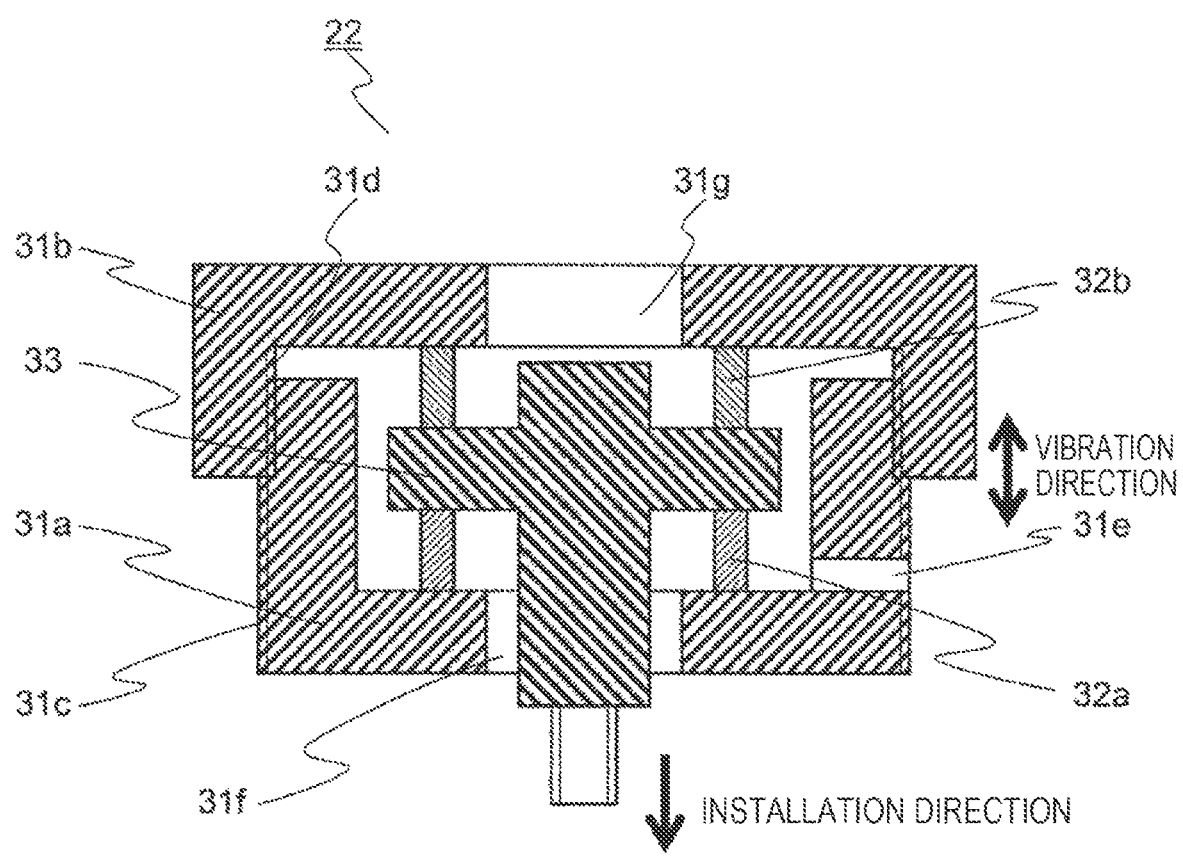
FIG. 10 is a cross-sectional view illustrating an example of a vibrator according to a fourth embodiment.

A vibration control mechanism that can easily obtain a larger vibrating force than those of the first to third embodiments will be described in the present embodiment. FIG. 10 is a cross-sectional view illustrating an example of a vibrator 22 according to the present embodiment. In FIG. 10, those having the same functions as those in FIGS. 4 and 9 will be denoted by the same reference signs, and redundant descriptions will be omitted. The vibrator 22 includes a columnar stator 33 having a disk portion, cylindrical laminated piezoelectric elements 32a and 32b arranged so as to vertically sandwich the disk portion of the stator 33, and movers 31a and 31b arranged to further vertically sandwich the laminated piezoelectric elements 32a and 32b.

Both of the movers 31a and 31b have a cylindrical shape with a bottom, and have through-holes 31f and 31g at the bottoms, respectively. The lower mover 31a has a male screw portion 31c on the outer periphery thereof and the upper mover 31b has a female screw portion 31d on the inner periphery thereof such that the male screw portion 31c and the female screw portion 31d mesh with each other. The male screw portion 31c and the female screw portion 31d are fastened together in a state where the stator 33 and the laminated piezoelectric elements 32a and 32b are accommodated inside the movers 31a and 31b, and the movers 31a and 31b and the laminated piezoelectric elements 32a and 32b are fixed such that there is no gap and the stator 33 and the laminated piezoelectric elements 32a and 32b are fixed such that there is no gap. The lower mover 31a has a through-hole 31e in a part of a side surface, and an external wiring led to the laminated piezoelectric elements 32a and 32b is guided through the through-hole 31e.

The stator 33 has a male screw at the bottom, the male screw protrudes from the through-hole 31f and is fixed to a fixing ring 21 by screwing the stator 33 through the through-hole 31g. At that time, since the stator 33 is positioned inside the mover 31, it is preferable to prepare a part such as a head of a hexagon socket head bolt on an upper surface of the stator 33 to be screwed with a hexagonal wrench through the through-hole 31f provided in the mover 31.

When a voltage is applied, the laminated piezoelectric elements 32a and 32b extend and contract in the vertical direction of the drawing to vibrate the movers 31a and 31b. The vibrator 22 uses driving reaction forces of the movers 31a and 31b as vibrating forces. The rigidity of fastening the movers 31a and 31b together in the vibration direction is set to be higher than the rigidity in the vibration direction of the laminated piezoelectric elements 32a and 32b.

Since the vibrating movers 31a and 31b are positioned outside the vibrator 22 in the present embodiment, the movers 31a and 31b can be increased in size so that the mass is easily increased, and it is easy to increase the force generated by the vibrator 22 as compared with the first to third embodiments. When the movers 31a and 31b are fixed to be fastened together in the vibration direction by the male screw portion 31c and the female screw portion 31d at the time of assembly, it is possible to perform the assembly without any gap even if the tolerance of the thicknesses of the laminated piezoelectric elements 32a and 32b is large, and the assembly work becomes easy. In addition, when the rigidity of fastening the movers 31a and 31b together in the vibration direction is set to be higher than the rigidity in the vibration direction of the laminated piezoelectric elements 32a and 32b, the movers 31a and 31b positioned at both ends of the laminated piezoelectric elements 32a and 32b can be regarded as the inertial mass of one rigid body. As a result, it is possible to drive the movers 31a and 31b by reducing the hysteresis characteristic of the laminated piezoelectric elements 32a and 32b without individually vibrating the movers 31a and 31b. The other effects are the same as those of the first to third embodiments.

Figure 11:
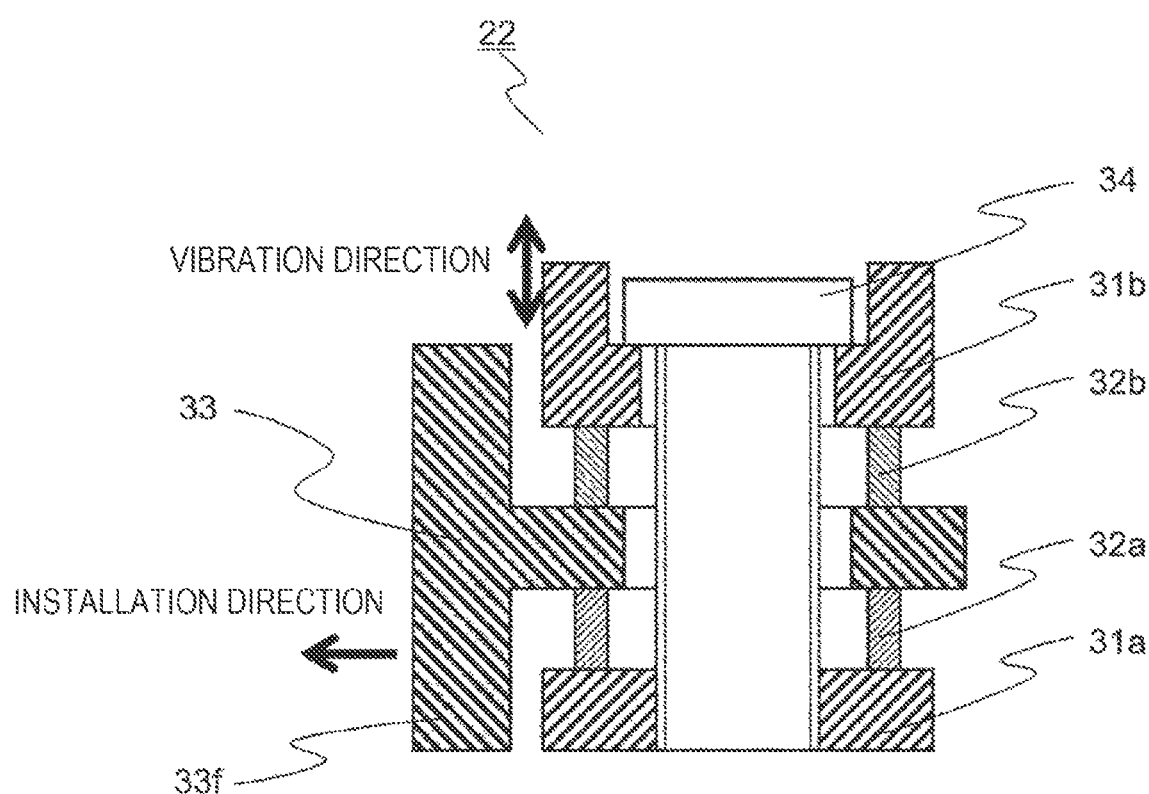
FIG. 11 is a cross-sectional view illustrating a modification of the vibrator according to the fourth embodiment.

In addition, a cross-sectional view of a modification of the vibrator 22 of the present embodiment is illustrated in FIG. 11. In FIG. 11, those having the same functions as those in FIGS. 4, 9, and 10 will be denoted by the same reference signs, and redundant descriptions will be omitted. A vibrator 22 includes a stator 33 having a through-hole at the center, cylindrical laminated piezoelectric elements 32a and 32b arranged so as to vertically sandwich the stator 33, and movers 31a and 31b arranged so as to further vertically sandwich the laminated piezoelectric elements 32a and 32b. The upper mover 31b has a through-hole at the center, and the lower mover 31a has a female screw at the center. A fixing bolt 34 fastens the movers 31a and 31b together such that the movers 31a and 31b and the laminated piezoelectric elements 32a and 32b are fixed such that there is no gap and the stator 33 and the laminated piezoelectric elements 32a and 32b are fixed such that there is no gap.

The stator 33 has an attachment portion 33f and is fixed to a fixing ring 21. When a voltage is applied, the laminated piezoelectric elements 32a and 32b extend and contract in the vertical direction of the drawing to vibrate the movers 31a and 31b. The vibrator 22 uses driving reaction forces of the movers 31a and 31b as vibrating forces. The fixing bolt 34 is configured to have the rigidity in the vibration direction higher than the rigidity in the vibration direction of the laminated piezoelectric elements 32a and 32b.

Since the vibrating movers 31a and 31b are positioned outside the vibrator 22 in the present embodiment, the movers 31a and 31b can be increased in size so that the mass is easily increased, and it is possible to increase the force generated by the vibrator 22 as compared with the first to third embodiments.

When the movers 31a and 31b are fixed to be fastened together in the vibration direction by the fixing bolts 34 at the time of assembly, it is possible to perform the assembly without any gap even if the tolerance of the thicknesses of the laminated piezoelectric elements 32a and 32b is large, and the assembly becomes easy. In addition, when the rigidity in the vibration direction of the fixing bolt 34 is set to be higher than the rigidity in the vibration direction of the laminated piezoelectric elements 32a and 32b, the movers 31a and 31b positioned at both ends of the laminated piezoelectric elements 32a and 32b can be regarded as the inertial mass of one rigid body. As a result, it is possible to drive the movers 31a and 31b by reducing the hysteresis characteristic of the laminated piezoelectric elements 32a and 32b without individually vibrating the movers 31a and 31b. The other effects are the same as those of the first to third embodiments.

REFERENCE SIGNS LIST 1 sample chamber
2 column
3 X-table
4 Y-table
5 sample stage
6 sample
7 electron gun
8 primary electron beam
9 condenser lens
10 scanning deflector
11 objective lens
12 ion pump
20 vibration control mechanism
21 fixing ring
22, 22a, 22b vibrator
23, 23a, 23b vibration sensor
24 controller
31, 31a, 31b mover
32a, 32b laminated piezoelectric element
33, 33a, 33b stator
34 fixing bolt
100 charged particle beam device

The invention claimed is:

1. A vibration-suppressing mechanism to be attached to a charged particle beam device, the vibration-suppressing mechanism comprising:
a first arcuate member that has an inner wall surface shaped along an outer wall of a column of the charged particle beam device;
a second arcuate member that has an inner wall surface shaped along an outer wall of a column of the charged particle beam device and is connected with the first arcuate member to form an annular member surrounding the outer wall of the column of the charged particle beam device;
a first connecting member that fastens one end of the first arcuate member and one end of the second arcuate member together;
a second connecting member consisting of a hinge connecting the other end of the first arcuate member and the other end of the second arcuate member or a fastening member connecting the other end of the first arcuate member and the other end of the second arcuate member;
a vibration sensor attached to each of the first arcuate member and the second arcuate member; and
at least two actuators that operate in response to an output of the vibration sensor,
wherein connection between the one end of the first arcuate member and the one end of the second arcuate member is released by releasing the connection obtained by the first connecting member.

2. The vibration-suppressing mechanism to be attached to a charged particle beam device according to claim 1, wherein
the actuator includes: a stator having first and second surfaces, which oppose each other, and attached to the arcuate member;
a mover arranged between the first surface and the second surface;
a first piezoelectric element connecting the first surface and a surface of the mover opposing the first surface; and
a second piezoelectric element connecting the second surface and a surface of the mover opposing the second surface.

3. The vibration-suppressing mechanism to be attached to a charged particle beam device according to claim 2, further comprising
a controller that applies a voltage to the first piezoelectric element and the second piezoelectric element,
wherein the controller supplies a drive signal to pull the mover by the second piezoelectric element when the mover is pressed by the first piezoelectric element and supplies a drive signal to pull the mover by the first piezoelectric element when the mover is pressed by the second piezoelectric element, at a time of applying a vibration to the arcuate member using the actuator.

4. The vibration-suppressing mechanism to be attached to a charged particle beam device according to claim 2, further comprising
a controller that applies a voltage to the first piezoelectric element and the second piezoelectric element,
wherein the controller applies voltages having opposite phases to the first piezoelectric element and the second piezoelectric element, respectively, in a state where a bias voltage is applied to the first piezoelectric element and the second piezoelectric element.

5. The vibration-suppressing mechanism to be attached to a charged particle beam device according to claim 2, wherein
the stator has a support portion that maintains a gap between the first surface and the second surface.

6. The vibration-suppressing mechanism to be attached to a charged particle beam device according to claim 5, wherein
the first piezoelectric element and the second piezoelectric element are surrounded by a cylindrical form surrounding the support portion or the support portion having a cylindrical shape.

7. The vibration-suppressing mechanism to be attached to a charged particle beam device according to claim 1, wherein
the actuator includes: a mover having a first surface and a second surface, which oppose each other;
a stator arranged between the first surface and the second surface and attached to the arcuate member;
a first piezoelectric element connecting the first surface and a surface of the stator opposing the first surface; and a second piezoelectric element connecting the second surface and a surface of the stator opposing the second surface.

8. The vibration-suppressing mechanism to be attached to a charged particle beam device according to claim 7, further comprising
a controller that applies a voltage to the first piezoelectric element and the second piezoelectric element,
wherein the controller supplies a drive signal to pull the mover by the second piezoelectric element when the mover is pressed by the first piezoelectric element and supplies a drive signal to pull the mover by the first piezoelectric element when the mover is pressed by the second piezoelectric element, at a time of applying a vibration to the arcuate member using the actuator.

9. The vibration-suppressing mechanism to be attached to a charged particle beam device according to claim 7, further comprising
a controller that applies a voltage to the first piezoelectric element and the second piezoelectric element,
wherein the controller applies voltages having opposite phases to the first piezoelectric element and the second piezoelectric element, respectively, in a state where a bias voltage is applied to the first piezoelectric element and the second piezoelectric element.

10. The vibration-suppressing mechanism to be attached to a charged particle beam device according to claim 7, wherein
the mover has a support portion that maintains a gap between the first surface and the second surface.

11. The vibration-suppressing mechanism to be attached to a charged particle beam device according to claim 10, wherein
the first piezoelectric element and the second piezoelectric element are surrounded by a cylindrical form surrounding the support portion or the support portion having a cylindrical shape.

12. A charged particle beam device comprising:
a charged particle beam column having a charged particle source;
a first arcuate member that has an inner wall surface shaped along an outer wall of the charged particle beam column;
a second arcuate member that has an inner wall surface shaped along an outer wall of a column of the charged particle beam device and is connected with the first arcuate member to form an annular member surrounding the outer wall of the column of the charged particle beam device;
a first connecting member that fastens one end of the first arcuate member and one end of the second arcuate member together;
a second connecting member consisting of a hinge connecting the other end of the first arcuate member and the other end of the second arcuate member or a fastening member connecting the other end of the first arcuate member and the other end of the second arcuate member;
a vibration sensor attached to each of the first arcuate member and the second arcuate member; and
at least two actuators that operate in response to an output of the vibration sensor,
wherein connection between the one end of the first arcuate member and the one end of the second arcuate member is released by releasing the connection obtained by the first connecting member.

\* \* \* \* \*